(12) United States Patent
Yang et al.

(10) Patent No.: US 10,671,108 B2
(45) Date of Patent: Jun. 2, 2020

(54) BANDGAP REFERENCE CIRCUIT FOR REDUCING POWER CONSUMPTION AND METHOD OF USING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Josh Yang, Shanghai (CN); Zhi Bing Deng, Shanghai (CN); Cheng Tai Huang, Shanghai (CN); Cheng Yi Huang, Shanghai (CN); Wen Jun Weng, Shanghai (CN); Jun Tao Guo, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/802,663

(22) Filed: Nov. 3, 2017

(65) Prior Publication Data

US 2018/0129237 A1    May 10, 2018

(30) Foreign Application Priority Data

Nov. 8, 2016    (CN) .......................... 2016 1 0981570

(51) Int. Cl.
*G05F 3/30*    (2006.01)
*G05F 3/24*    (2006.01)

(52) U.S. Cl.
CPC ................ *G05F 3/247* (2013.01); *G05F 3/30* (2013.01)

(58) Field of Classification Search
CPC . G05F 3/30; G05F 3/267; G05F 1/567; G05F 3/247
See application file for complete search history.

(56) References Cited

U.S. PATENT DOCUMENTS 5,949,227 A  *  9/1999  Bujanos .................. G05F 3/242
                                                          323/313
6,310,491 B1 * 10/2001  Ogawa ..................... H03K 3/37
                                                          326/113

(Continued)

FOREIGN PATENT DOCUMENTS

CN        1335626 A    2/2002
EP        0840193 A1   5/1998

OTHER PUBLICATIONS

The European Patent Office (EPO) The Extended European Search Report for 17199817.2 dated Apr. 9, 2018 10 Pages.

*Primary Examiner* — Kyle J Moody
*Assistant Examiner* — Peter M Novak
(74) *Attorney, Agent, or Firm* — Anova Law Group, PLLC

(57) ABSTRACT

A bandgap reference circuit and method of using the same are provided. The bandgap reference circuit includes a startup component; an output component; and a bandgap core component coupled there-between. The bandgap core component includes a reference point having a voltage associated with an output signal of the output component. A controller is configured for controlling the bandgap core component and the output component to switch between a low power consumption mode and a normal operation mode based on the voltage at the reference point. When the bandgap core component and the output component operate in the normal operation mode, the bandgap reference circuit outputs a stable voltage and has a first power consumption. When the bandgap core component and the output compo- (Continued)

nent operate in the low power consumption mode, the bandgap reference circuit has a second power consumption less than the first power consumption.

17 Claims, 4 Drawing Sheets

(56) References Cited

U.S. PATENT DOCUMENTS

| | | | |
|---|---|---|---|
| 6,411,157 B1 * | 6/2002 | Hsu | ........................ G11C 11/406 327/534 |
| 6,844,711 B1 | 1/2005 | Sutardja et al. | |
| 6,894,473 B1 | 5/2005 | Le et al. | |
| 2003/0218478 A1 | 11/2003 | Sani et al. | |
| 2014/0337568 A1 | 11/2014 | Oh et al. | |

* cited by examiner

BANDGAP REFERENCE CIRCUIT FOR REDUCING POWER CONSUMPTION AND METHOD OF USING THE SAME

CROSS-REFERENCES TO RELATED APPLICATIONS

This application claims the priority of Chinese Patent Application No. 201610981570.2, filed on Nov. 8, 2016, the entire contents of which are incorporated herein by reference.

FIELD OF THE DISCLOSURE

The present disclosure generally relates to the field of circuit technology and, more particularly, relates to a bandgap reference circuit and method for using the same.

BACKGROUND

At present, a bandgap reference circuit can be used as a stable voltage supply for wearable electronic devices. The wearable electronic devices generally require a low power consumption. Thus, reducing the power consumption of the bandgap reference circuit can help meet the low power consumption requirement of the wearable electronic devices. In fact, for other electronic equipment having the low power consumption requirement, reducing the power consumption of the bandgap reference circuit can be also very important.

To reduce the power consumption of the bandgap reference circuit, a high power consumption mode and a low power consumption mode of the bandgap reference circuit are respectively designed. When the function of the bandgap reference circuit is not needed, the bandgap reference circuit can be switched to the low power consumption mode. The high power consumption mode is relative to the low power consumption mode. Actually, the high power consumption mode is the normal operation mode of the bandgap reference circuit to generate stable output when the saving of the power consumption is not required. Therefore, the power consumption may be saved by switching the bandgap reference circuit between the high power consumption mode and the low power consumption mode.

However, the existing the bandgap reference circuits have a high design cost. The disclosed bandgap reference circuit is directed to solve one or more problems set forth above and other problems.

BRIEF SUMMARY OF THE DISCLOSURE

One aspect of present disclosure provides a bandgap reference circuit, comprising: a startup component; an output component; a bandgap core component coupled between the startup component and the output component, wherein the bandgap core component includes a reference point, and a voltage at the reference point is associated with an output signal of the output component; and a controller configured for controlling the bandgap core component and the output component to switch between a low power consumption mode and a normal operation mode based on the voltage at the reference point; wherein: when the bandgap core component and the output component operate in the normal operation mode, the bandgap reference circuit outputs a stable voltage and has a first power consumption, and when the bandgap core component and the output component operate in the low power consumption mode, the bandgap reference circuit has a second power consumption less than the first power consumption.

Another aspect of the present disclosure provides a method for using a bandgap reference circuit, comprising: powering on a startup component to provide a starting voltage to enable a bandgap reference circuit including an output component and a bandgap core component coupled between the startup component and the output component, wherein the bandgap core component includes a reference point, and a voltage at the reference point is associated with an output signal of the output component; and using a controller to control the bandgap reference circuit to switch between a low power consumption mode and a normal operation mode based on the voltage at the reference point; wherein: when the bandgap core component and the output component operate in the normal operation mode, the bandgap reference circuit outputs a stable voltage and has a first power consumption, and when the bandgap core component and the output component operate in the low power consumption mode, the bandgap reference circuit has a second power consumption less than the first power consumption.

Other aspects of the present disclosure can be understood by those skilled in the art in light of the description, the claims, and the drawings of the present disclosure.

BRIEF DESCRIPTION OF THE DRAWINGS

Various objectives, features, and advantages of the present disclosure can be more fully appreciated with reference to the detailed description of the present disclosure when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Reference input now be made in detail to exemplary embodiments of the invention, which are illustrated in the accompanying drawings in order to fully understand and being able to implementing the present disclosure and to realizing the technical effect. It should be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

The present disclosure provides an exemplary bandgap reference circuit and an exemplary method for using/controlling the bandgap reference circuit.

In some embodiments, a controller is provided in the disclosed bandgap reference circuit. The controller is used to control a bandgap core component and an output component to switch between a low power consumption mode and a normal operation mode. When the bandgap core component is in the low power consumption mode, a voltage of a reference point can be detected starting from a detection timing. A low power consumption control signal or a normal operation control signal can be generated based on the detected voltage at the reference point.

The low power consumption control signal can cause the bandgap core component and the output component to be in the low power consumption mode. And the normal operation control signal can cause the bandgap core component and the output component to be in the normal operation mode. A current consumption in the low power consumption mode is less than the current consumption in the normal operation mode.

Unlike conventional circuits, there is no need to design and include an additional low power consumption mode circuit according to some embodiments of the present disclosure. By using the controller to control the switching of the bandgap core component and the output component between the low power consumption mode and the normal operation mode, the bandgap core component and the output component can be avoided to keep operating in the normal operation mode which causes a high power consumption, and the circuit design costs can be saved as well.

Further, in some embodiments, the detection timing can be determined based on the duration of the bandgap core component in the low power consumption mode at a previous round. The voltage at the reference point can be detected starting from the determined detection timing. Therefore, the detection of the voltage at the reference point can be ensured for further determination. Additionally, it is not required to continuously detect the voltage at the reference point, which can further save the power consumption.

Figure 1:
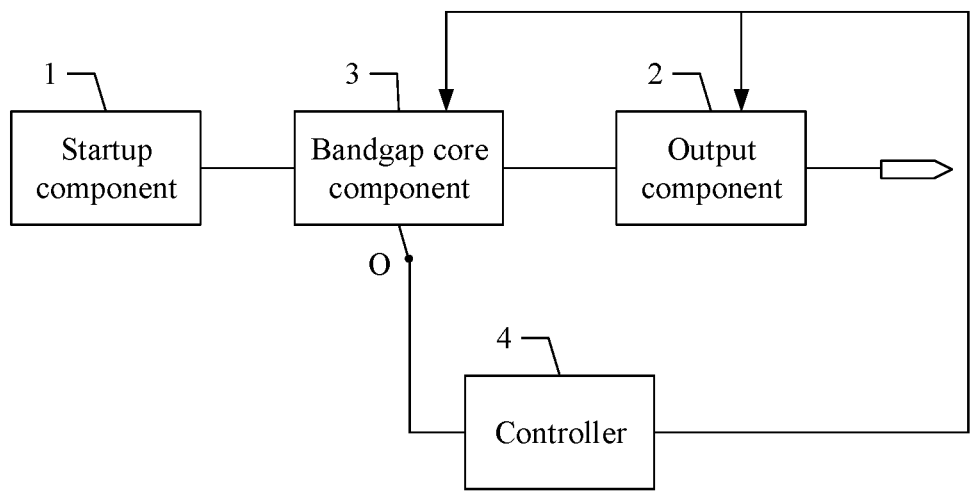
FIG. 1 illustrates a schematic structural view of an exemplary bandgap reference circuit in accordance with some embodiments of the present disclosure.

FIG. 1 illustrates a schematic structural view of an exemplary bandgap reference circuit in accordance with some embodiments of the present disclosure.

As illustrated, the bandgap reference circuit may include a startup component 1, an output component 2, a bandgap core component 3 coupled between the startup component 1 and the output component 2. The bandgap core component 3 has a reference point O. A voltage at the reference point O is associated with an output signal of the output component 2. The bandgap reference circuit may further include a controller 4.

The startup component 1 can be used to provide a starting voltage to the bandgap core component 2 and the output component 4 under a control of the bias voltage. The startup component 1 can also ensure that the bandgap reference circuit can be normally started when the circuit system is powered up.

The bandgap core component 2 can be used to generate a first current having a positive temperature coefficient and a second current having a negative temperature coefficient, and superimpose the first current and the second current to generate a reference current.

The output component 3 can be used to convert the reference current generated by the bandgap core component 2 to a reference voltage, and output the reference voltage.

In some embodiments, the bandgap core component 3 has a reference point O. The voltage at the reference point O is associated with an output signal of the output component 2. In particular, when the output voltage of the output component 2 is about to be unstable, the voltage at the reference point O in the bandgap core component 3 may change greatly. In other words, the voltage at the reference point O is more sensitive to the change of the output voltage of the output component 2. The voltage at the reference point O can have a great change before the output voltage of the output component 2 becomes unstable. That is, a detectable changing of the voltage at reference point O can indicate that the output voltage of the output component 2 is going to be unstable.

It should be noted that, the reference point O is shown outside of the bandgap core component 3 in FIG. 1. In fact, the reference point O is located inside of the bandgap core component 3.

In some embodiments, the controller 4 can control the bandgap core component 3 and the output component 2 to switch between a low power consumption mode and a normal operation mode. When the bandgap core component 3 is in the low power consumption mode, the controller 4 can detect the voltage at the reference point O starting from a detection timing. Based on the detected voltage at the reference point, the controller 4 can generate a low power consumption control signal or a normal operation control signal.

Specifically, the normal operation mode can be referred to a power consumption mode of the bandgap reference circuit that is in a normal operating state to generate a stable voltage output. That is, when the startup component 1 provides the starting voltage, the bandgap reference circuit can enter the normal operation mode to output a stable reference voltage.

In some embodiments, the bandgap reference circuit can continually maintain the normal operating mode without considering the power saving of the bandgap reference circuit. However, the bandgap reference circuit may have high power consumption when maintained in the normal operation mode. Therefore, in order to save power consumption, the controller 4 can be configured for switching the bandgap core component 3 and the output component 2 into the low power consumption mode as appropriate.

The controller 4 may generate a low power consumption control signal or a normal operation control signal according to the voltage at the reference point O in the bandgap core component 3. The low power consumption control signal can cause the bandgap core component 3 and the output component 2 to be operated in the low power consumption mode, the normal operation control signal can cause the bandgap core component 3 and the output component 2 to be operated in the normal operation mode.

In some embodiments, the voltage at the reference point O can be detected starting from the detection timing. Based on the detected voltage at the reference point O, the normal operation mode and the low power consumption mode can be switched to each other. The voltage changing at the reference point O can be more sensitive before the output voltage of the bandgap reference circuit becomes unstable. According to the real-time voltage changing at the reference point O, the bandgap core component 3 and output component 2 can be switched to the normal operation mode to ensure a stable output voltage of the bandgap reference circuit. The bandgap core component 3 and the output component 2 can be switch to the low power consumption mode after operating in the normal operation mode with a period of time, thereby saving the power consumption of the bandgap reference circuit.

In a non-limiting implementation, the controller 4 can generate a normal operation control signal when the voltage at the reference point O is higher than a voltage threshold. The controller 4 can generate a low power consumption control signal when the voltage at the reference point O is lower than the voltage threshold.

For example, when the voltage outputted from the bandgap reference circuit is about to be unstable, the voltage at the reference point O can increase. When the voltage at the reference point O is detected to increase to the preset voltage threshold, the controller 4 can generate a normal operation control signal to switch the bandgap core component 3 and the output component 2 to the normal operation mode. As such, a stable voltage output from the bandgap reference circuit can be ensured. When the voltage at the reference point O is detected not to reach the voltage threshold, the controller 4 can generate a low power consumption control signal, allowing the bandgap core component 3 and the output component 2 to remain in a low power consumption mode.

From the above description, it can be seen that, by detecting the voltage at the reference point O in the bandgap core component 3, it can be determined whether to make the bandgap core component 3 and the output component 2 in the normal operation mode. When it is determined that the normal operation mode is not required, the bandgap core component 3 and the output component 2 can be switched to the low power consumption mode. Comparing to the existing techniques, the disclosed bandgap reference circuit does not need to design an additional circuit for the low power consumption mode. Therefore, not only the power consumption of the band gap reference circuit can be saved, but also the design cost can be saved.

In some embodiments, the detection timing can be determined based on the duration of the bandgap core component 3 in the low power consumption mode at the previous round. The voltage at the reference point O can be detected starting from the determined detection timing. Therefore, it is not necessary to continuously detect the voltage at the reference point O, thereby saving the power consumption for detecting the voltage at the reference point O before the detection timing. As such, the power consumption of the bandgap reference circuit can be further saved.

Accordingly, in some embodiments of the disclosed bandgap reference circuit, an additional low power consumption mode circuit is not required to be designed. By using the controller 4 to control the switching of the bandgap core component 3 and the output component 2 between the low power consumption mode and the normal operation mode, the bandgap core component 3 and the output component 2 can be avoided to keep operating in the normal operation mode to cause a high power consumption, and the circuit design costs can be saved as well.

Further, in some embodiments, the detection timing can be determined based on the duration of the bandgap core component 3 in the low power consumption mode at the previous round. The voltage at the reference point can be detected starting from the determined detection timing. Therefore, the detection of the voltage at the reference point can be ensured for further determination. Additionally, it is not required to continuously detect the voltage at the reference point, which can further save the power consumption.

Figure 2:
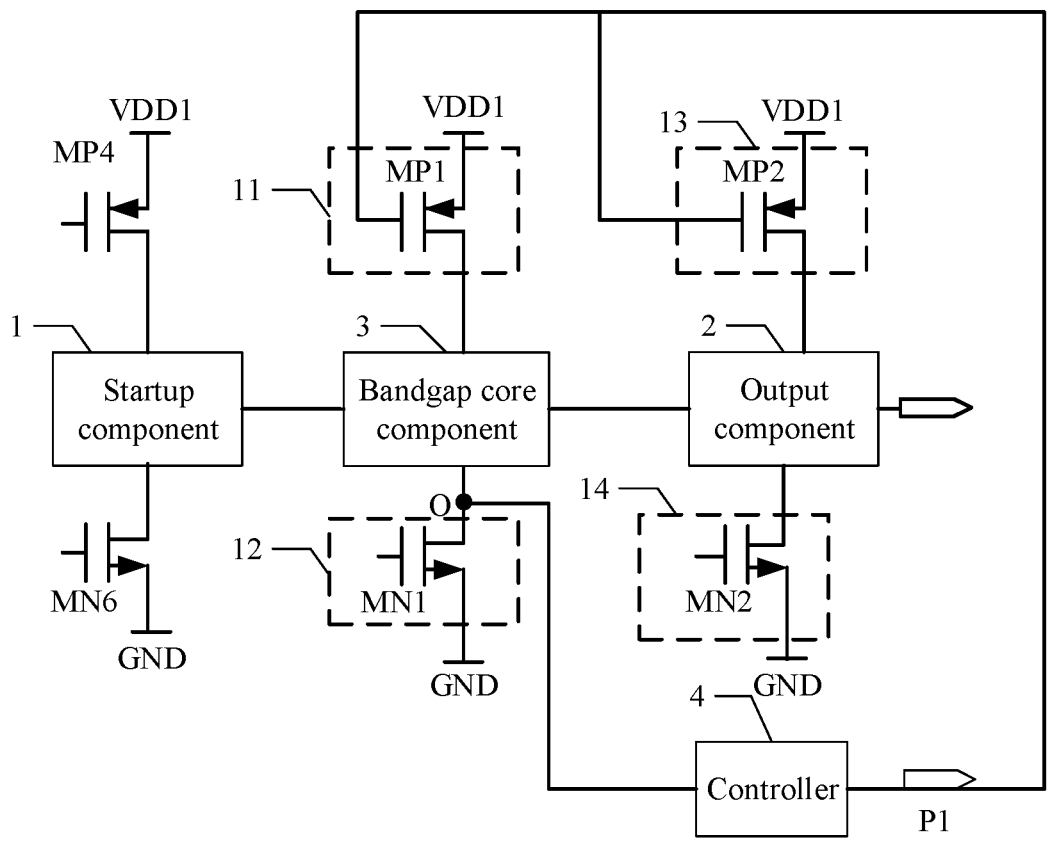
FIG. 2 illustrates a schematic structural view of another exemplary bandgap reference circuit in accordance with some other embodiments of the present disclosure.

Referring to FIG. 2, a schematic structural view of another exemplary bandgap reference circuit is shown in accordance with some other embodiments of the present disclosure.

As illustrated, the bandgap reference circuit may include a startup component 1, an output component 2, a bandgap core component 3 coupled between the startup component 1 and the output component 2. The bandgap core component 3 has a reference point O. A voltage at the reference point O is associated with an output signal of the output component 2. The bandgap reference circuit may further include a controller 4.

In some embodiments, the controller 4 can control the bandgap core component 3 and the output component 2 to switch between a low power consumption mode and a normal operation mode. When the bandgap core component 3 is in the low power consumption mode, the controller 4 can detect the voltage at the reference point O starting from a detection timing. Based on the detected voltage at the reference point, the controller 4 can generate a low power consumption control signal or a normal operation control signal.

The low power consumption control signal can cause the bandgap core component 3 and the output component 2 to be operated in the low power consumption mode, the normal operation control signal can cause the bandgap core component 3 and the output component 2 to be operated in the normal operation mode.

In some specific implementations, the bandgap reference circuit may include a first switching device 11, a second switching device 12, a third switching device 13, and a fourth switching device 14.

The first switching device 11 can be coupled between a first voltage supply VDD1 and a power source terminal of the bandgap core component 3. The second switching device 12 can be coupled between the bandgap core component 3 and the ground GND. The third switching device 13 can be coupled between the first voltage supply VDD1 and a power source terminal of the output component 2. The fourth switching device 14 can be coupled between the output component 2 and the ground GND.

The signals generated by the controller 4 based on the voltage at the reference point O can be outputted at the output terminal P1. The signals can control the first switching device 11 and the second switching device 12 to be turned on or off, so that the bandgap core component 3 can be operated in the normal operation mode or in the low power consumption mode. Further, the signals can control the third switching device 13 and the fourth switching device 14 to be turned on or off, so that the output component 2 can be operated in the normal operation mode or in the low power consumption mode.

In some specific implementations, the first switching device 11 may be a first PMOS transistor MP1. The second switching element 12 may be a first NMOS transistor MN1. The third switching element 13 may be a second PMOS transistor MP2. The fourth switching device 14 may be a second NMOS transistor MN2.

A source of the first PMOS transistor MP1 can be coupled to the first voltage supply VDD1. A gate of the first PMOS transistor MP1 can be coupled to the output terminal of the controller 4. A drain of the first PMOS transistor MP1 can be coupled to the power source terminal of the bandgap core component 3.

A source of the first NMOS transistor MN1 can be couple to the ground GND. A gate of the first NMOS transistor MN1 can be coupled to an inverted signal of the signal outputted from the output terminal P1 of the controller 4. A drain of the first NMOS transistor MN1 can be coupled to the reference point O.

A source of the second PMOS transistor MP2 can be coupled to the first voltage supply VDD1. A gate of the second PMOS transistor MP2 can be coupled to the output terminal P1 of the controller 4. A drain of the second PMOS transistor MP2 can be coupled to the power source terminal of the output component 2.

A source of the second NMOS transistor MN2 can be coupled to the ground GND. A gate of the second NMOS transistor MN2 can be coupled to the inverted signal of the signal outputted from the output terminal P1 of the controller 4. A drain of the second NMOS transistor MN2 can be coupled to the output component 2.

Still referring to FIG. 2, in some particular implementations, the startup component 1 may be turned off after the bandgap core component 3 is operated in a stable manner.

In some other implementations, the bandgap reference circuit may further include a fourth PMOS transistor MP4 and a sixth NMOS transistor MN6.

A source of the fourth PMOS transistor MP4 can be coupled to the first voltage supply VDD1. A gate of the fourth PMOS transistor MP4 can be coupled to a starting up signal. A drain of the fourth PMOS transistor MP4 can be coupled to the startup component 1.

A drain of the sixth NMOS transistor MP6 can be coupled to the startup component 1. A source of the sixth NMOS transistor MN6 can be coupled to the ground GND. A gate of the sixth NMOS transistor MN6 can be coupled to an inverted signal of the starting up signal.

Figure 3:
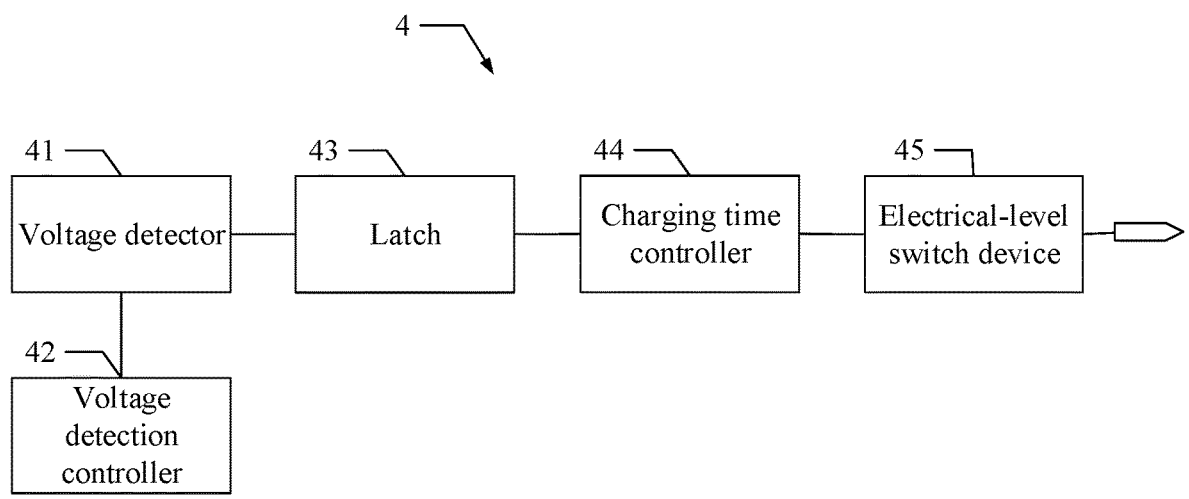
FIG. 3 illustrates a schematic structural view of an exemplary controller in accordance with some embodiments of the present disclosure.

Referring to FIG. 3, a schematic structural view of an exemplary controller is shown in accordance with some embodiments of the present disclosure. The controller can be the controller shown in FIG. 1.

As illustrated, the controller 4 may include a voltage detector 41, a voltage detection controller 42, a latch 43, and a charging time controller 44, and an electrical-level switching device 45.

The voltage detection controller 42 can be used to generate a detection enable signal EN_CONTROL based on the duration of the bandgap core component 3 in the low power consumption mode at a previous round.

The voltage detector 41 can be used to determine the detection time based on the detection enable signal EN_CONTROL. The voltage detector 41 can be further used to detect the voltage at the reference point O starting from the detection timing, and to output a first voltage signal based on the voltage at the reference point O.

The latch 43 can be used to latch the first voltage signal outputted from the voltage detector 41.

The charging time controller 44 can be used to generate a normal operation control signal based on the first voltage signal latched by the latch 43. The normal operation control signal can control the first switching device 11 and the third switching device 13 to be turned on. The charging time controller 44 can be further used to generate a low power consumption control signal when the duration of the normal operation mode exceeds a preset time threshold. The low power consumption control signal can control the first switching device 11 and the third switching device 13 to be turned off.

In some embodiments, the detection timing at which to start the voltage detection at the reference point O can be determined by the voltage detection controller 42. For example, when the detection enable signal EN_CONTROL generated by the voltage detection controller 42 is at low level "0", the time when the voltage detector 41 detects that the enable signal is "0" may be set as the detection timing. Starting from the detection timing, the voltage detector 41 can detect the voltage at the reference point O.

In some implementations, the voltage detection controller 42 can generate the detection enable signal EN_CONTROL based on the duration of the bandgap core component 3 in the low power consumption mode at the previous round. In other words, the duration of the bandgap core component 3 in the low power consumption mode at the previous round determines the current detection timing.

In some embodiments, by setting the voltage detection controller 42, the detection enable control signal EN_CONTROL can be generated according to the duration of the bandgap core component 3 in the low power consumption mode at the previous round. As such, the detection timing can be determined to ensure the detection of the voltage changing at the reference point O. Additionally, it is not required to continuously detect the voltage at the reference point O, which can save the power consumption.

In some specific implementations, a ratio between a duration of the bandgap core component 3 in the low power consumption mode in a current round and a duration of the bandgap core component 3 in the low power consumption mode in a previous round can be calculated. If the ratio reaches a preset threshold value, the voltage detection controller 42 can generate a detection enable signal EN_CONTROL.

Specifically, the voltage detection controller 41 may start recording the time from when the bandgap core component 3 starts to enter the low power consumption mode. When the ratio between the duration of the bandgap core component 3 in the low power consumption mode in the current round and the duration of the bandgap core component 3 in the low power consumption mode in the previous round reaches the preset threshold value, the detection enable signal EN_CONTROL can be generated.

Figure 4:
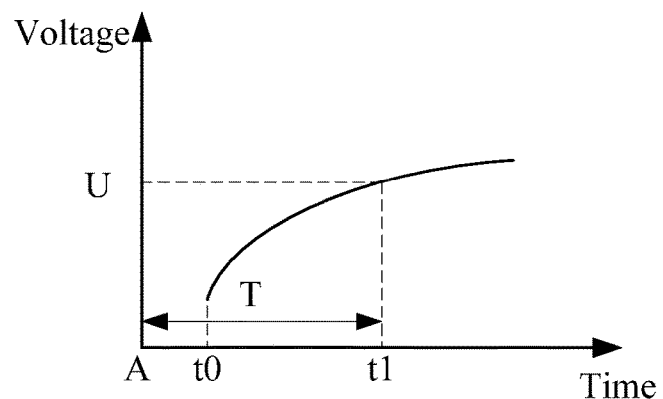
FIG. 4 illustrates a reference point voltage variation diagram of an exemplary bandgap core component in accordance with some embodiments of the present disclosure.

The preset threshold value of the ratio can be referred to the following descriptions in connection with FIGS. 1 and 4.

Referring to FIG. 4, a reference point voltage variation diagram of an exemplary bandgap core component is shown in accordance with some embodiments of the present disclosure. Specifically, FIG. 4 shows a schematic diagram of a voltage change at the reference point of the bandgap core component 3 during a period of being in the low power consumption mode.

As illustrated, the voltage at the reference point O of the bandgap core component 3 can increase before the output voltage of the bandgap reference circuit become unstable. Time point A indicates the time when the bandgap core component 3 is switched from the normal operation mode to the low power consumption mode. When the bandgap core component 3 operates in the low power consumption mode, the output voltage of the bandgap reference circuit may remain stable during a certain period before the output voltage becomes unstable.

At time point to, the voltage at the reference point O of the bandgap core component 3 begins to increase before the output voltage becomes unstable. After a time interval T from the time point A, that is, at time point t1, the voltage at the reference point O of the bandgap core component 3 can increase to a voltage threshold U.

Ideally, the preset threshold value of the ratio may be set to 1 irrespective of the influence of the ambient temperature.

When the preset threshold value of the ratio is 1, the detection of the reference point O voltage can be initiated in every same period that the bandgap core component 3 being in the low power consumption mode. For example, referring to FIG. 4, the voltage at the reference point O can be detected every fixed time period T. As another example, the voltage at the reference point O can be detected every fixed time period that is less than T. Ideally, the voltage changing at the reference point O can be same for every period. That is, the voltage reference U can always be reached at time point t1. As such, the voltage threshold U can be detected each time. Therefore, the bandgap core component 3 can be controlled to enter the normal operation mode based on the voltage threshold U.

However, in the practical application of the embodiments of the present disclosure, the preset threshold value of the ratio can be set to a value less than one. Due to the influence of the ambient temperature, the voltage changing at the reference point O may fluctuate before the output voltage of the bandgap reference circuit becomes unstable. For example, referring to FIG. 4, it is possible that the voltage at the reference point O has increased to the voltage threshold value U before the time point t0. It may also cost different time lengths for the voltage increasing to the voltage threshold U at each time.

It should be noted that, the duration of the bandgap core component 3 in the low power mode at the previous round has a correlation with the current time period that the voltage at the reference point O reaches the voltage threshold U. Therefore, the ratio between the duration of the bandgap core component 3 in the low power consumption mode in the current round and the duration of the bandgap core component 3 in the low power consumption mode in the previous round can be monitored. Starting at the time when the ratio reaches the preset threshold value, the voltage at the reference point O can be detected. As such, starting detection from the detection timing, it can be ensured that the voltage threshold value U can be detected for further determination and control of the operation mode. Therefore, the high power consumption caused by continuously voltage detection at the reference voltage O can be saved, and a stable reference voltage outputted by the bandgap reference circuit can be ensured.

In some embodiments, the preset threshold value of the ratio can be 95%.

As shown in FIG. 3, in some implementations, the controller 4 may also include an electrical-level switching device 45. With reference to FIGS. 2 and 3, the electrical-level switching device 45 can be used to perform an electrical level switch to the normal operation control signal or the low power consumption control signal generated by the charging time controller 44. The normal operation control signal after the electrical level switch can be used to turn on the first switching device 11 and the third switching device 13. The low power consumption control signal after the electrical level switch can be used to turn off the first switching device 11 and the third switching device 13.

Figure 5:
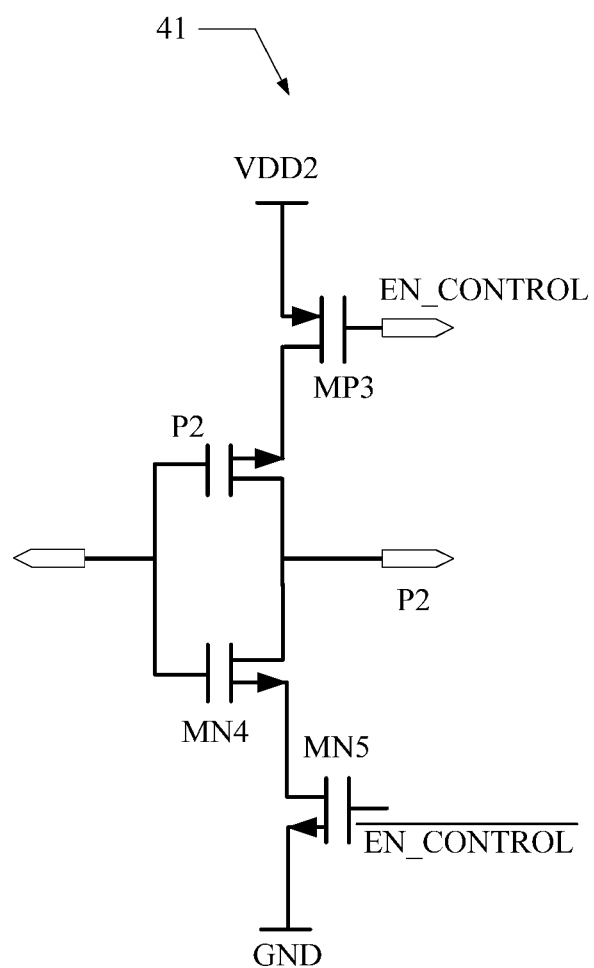
FIG. 5 illustrates a schematic structural view of an exemplary voltage detector shown in FIG. 2 in accordance with some embodiments of the present disclosure.

Referring to FIG. 5, a schematic structural view of an exemplary voltage detector 41 shown in FIG. 2 is illustrated in accordance with some embodiments of the present disclosure. The voltage detector 42 may include a third PMOS transistor MP3, a third NMOS transistor MN3, a fourth NMOS transistor MN4, and a fifth NMOS transistor MN5.

A source of the third PMOS transistor MP3 can be coupled to a second voltage supply VDD2. A gate of the third PMOS transistor MP3 can be coupled to detection enable signal EN_CONTROL.

A source of the third NMOS transistor MN3 can be coupled to a drain of the third PMOS transistor MN3. A gate of the third NMOS transistor MN3 can be coupled to the reference point O. A drain of the third NMOS transistor MN3 can be coupled to an input terminal of the latch 43 and be used as an output P2 of the voltage detector 42.

A gate of the fourth NMOS transistor MN4 can be coupled to the gate of the third NMOS transistor MN3. A drain of the fourth NMOS transistor MN4 can be coupled to the drain of the third NMOS transistor MN3.

A gate of the fifth NMOS transistor MN5 can be coupled to an inverted signal of the detection enable signal EN_CONTROL. A source of the fifth NMOS transistor MN5 can be coupled to the ground GND. A drain of the fifth NMOS transistor MN5 can be coupled to a source of the four NMOS transistors MN4.

Figure 6:
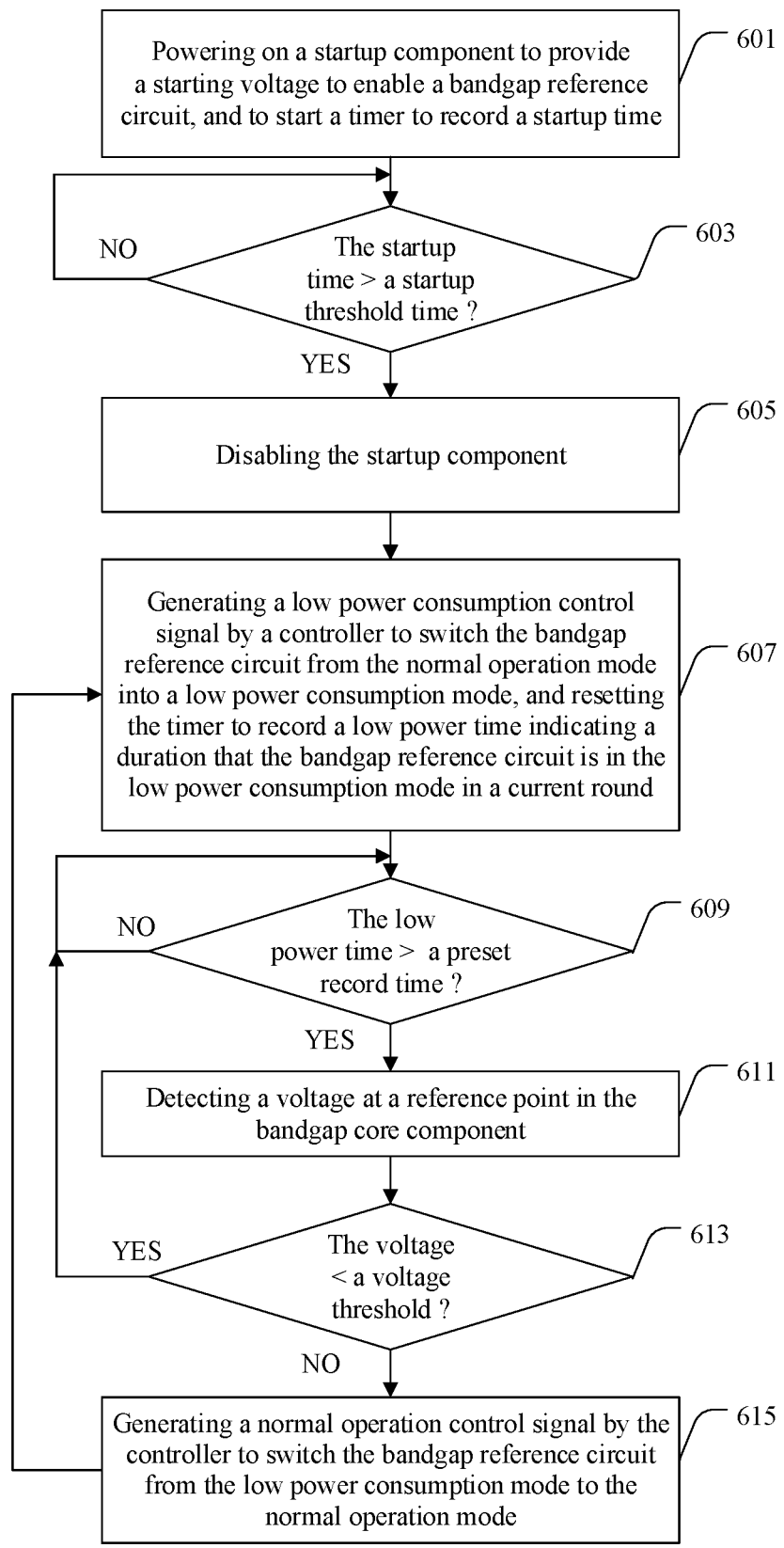
FIG. 6 illustrates a schematic flow diagram of an exemplary method for using a bandgap reference circuit in accordance with some embodiments of the present disclosure.

Referring to FIG. 6, a schematic flow diagram of an exemplary method for using a bandgap reference circuit is shown in accordance with some embodiments of the present disclosure.

As illustrated, at 601, a startup component can be powered on to provide a starting voltage to enable a bandgap reference circuit, and to start a timer to record a startup time. In some embodiments, the bandgap reference circuit can include an output component and a bandgap core component.

At 603, it can be determined whether the startup time is larger than a startup threshold time. In response to determining that the startup time is larger than the startup threshold time ("YES" at 603), the startup component can be disabled at 605. When the startup time is larger than a startup threshold time, it can indicate that the bandgap reference circuit enters a normal operation mode, and the output component of the bandgap reference circuit is able to output a stable reference voltage.

After a period of time, at 607, a controller can be enabled to generate a low power consumption control to switch the bandgap reference circuit from the normal operation mode into a low power consumption mode, and the timer can be reset to record a low power time indicating a duration that the bandgap reference circuit is in the low power consumption mode in a current round.

At 609, it can be determined whether the low power time is larger than a preset record time. In response to determining that the low power time is larger than the preset record time ("YES" at 609), a voltage at a reference point in the bandgap core component can be detected at 611.

At 613, it can be determined whether the real-time detected voltage at the reference point is smaller than a voltage threshold.

In response to determining that the voltage at the reference point is smaller than the voltage threshold ("YES" at 613), the controller can continuously generate the low power consumption control signal to keep the bandgap reference circuit in the low power consumption mode, and the process can go back to 609 to continuously detecting the voltage at the reference point in the bandgap core component.

In response to determining that the voltage at the reference point is larger than or equal to the voltage threshold ("NO" at 613), the controller can generate a normal operation control signal to switch the bandgap reference circuit from the low power consumption mode to the normal operation mode at 615, thus the output component of the bandgap reference circuit is able to output a stable reference voltage.

In the same time, the recorded detecting time can indicate a duration of the bandgap core component operating in the low power consumption mode in a previous round. The recorded detecting time can be associated with a coefficient to obtain a new record time. The coefficient can indicate a ratio between a duration of the bandgap core component operating in the low power consumption mode in a current round and a duration of the bandgap core component operating in the low power consumption mode in the previous round. In some embodiments, the ratio can be about to 95%, and the new record time can be the product of the recorded detecting time and the ratio.

After a period of time, the process can go back to 607, the controller can be enabled to generate the low power consumption control again to switch the bandgap reference circuit from the normal operation mode into a low power consumption mode, and the timer can be reset to record the low power time in the current round. The new record time can be used as the preset record time at 609.

It should be noted that the above steps of the flow diagram of FIG. 6 can be executed or performed in any order or sequence not limited to the order and sequence shown and described in the figure. Also, some of the above steps of the flow diagram of FIG. 6 can be executed or performed substantially simultaneously where appropriate or in parallel to reduce latency and processing times. Furthermore, it should be noted that FIG. 6 is provided as an example only. At least some of the steps shown in the figure may be performed in a different order than represented, performed concurrently, or altogether omitted Accordingly, a bandgap reference circuit and a method for using the same are provided.

The disclosed bandgap reference circuit includes a controller to control a bandgap core component and an output component to switch between a low power consumption mode and a normal operation mode. When the bandgap core component is in the low power consumption mode, a voltage of a reference point can be detected starting from a detection timing. A low power consumption control signal or a normal operation control signal can be generated based on the detected voltage at the reference point.

The low power consumption control signal can cause the bandgap core component and the output component to be in the low power consumption mode. And the normal operation control signal can cause the bandgap core component and the output component to be in the normal operation mode. A current consumption in the low power consumption mode is less than the current consumption in the normal operation mode.

Unlike conventional circuits, there is no need to design and include an additional low power consumption mode circuit according to some embodiments of the present disclosure. By using the controller to control the switching of the bandgap core component and the output component between the low power consumption mode and the normal operation mode, the bandgap core component and the output component can be avoided to keep operating in the normal operation mode which causes a high power consumption, and the circuit design costs can be saved as well.

In addition, the detection timing can be determined based on the duration of the bandgap core component in the low power consumption mode in a previous round. The voltage at the reference point can be detected starting from the determined detection timing. Therefore, the detection of the voltage at the reference point can be ensured for further determination. Additionally, it is not required to continuously detect the voltage at the reference point, which can further save the power consumption.

Further, when the duration of the bandgap core component in the low power mode reaches a preset ratio of a last during time of the bandgap core component in the low power mode, the time point can be determined as a detection time to start to detect the voltage at the reference point. The ratio is less than 1, and can be set as about 95%. As such, it can be ensured that the reference point voltage is able to be detected with a lower power consumption.

In some embodiments, the term "component" is referred to as a circuit, a device, or any suitable element configured in the bandgap reference circuit. For example, the startup component, the bandgap core component, and the output component may be referred to as a startup circuit, a bandgap core circuit, and an output circuit, respectively.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Although the present disclosure has been described and illustrated in the foregoing illustrative embodiments, it is understood that the present disclosure has been made only by way of example, and that numerous changes in the details of embodiment of the present disclosure can be made without departing from the spirit and scope of the present disclosure, which is only limited by the claims which follow. Features of the disclosed embodiments can be combined and rearranged in various ways. Without departing from the spirit and scope of the present disclosure, modifications, equivalents, or improvements to the present disclosure are understandable to those skilled in the art and are intended to be encompassed within the scope of the present disclosure.

What is claimed is:

1. A bandgap reference circuit, comprising:
   a startup component;
   an output component;
   a bandgap core component coupled between the startup component and the output component, wherein the bandgap core component includes a reference point, and a voltage at the reference point is associated with an output signal of the output component;
   a controller configured for controlling the bandgap core component and the output component to switch between a low power consumption mode and a normal operation mode based on the voltage at the reference point;
   wherein:
      when the bandgap core component and the output component operate in the normal operation mode, the bandgap reference circuit outputs a stable voltage and has a first power consumption, and
      when the bandgap core component and the output component operate in the low power consumption mode, the bandgap reference circuit has a second power consumption less than the first power consumption
   a first switching device coupled between a first voltage supply and a power source terminal of the bandgap core component;
   a second switching device coupled between the bandgap core component and a ground terminal;
   a third switching device coupled between the first voltage supply and the power source terminal of the output component; and
   a fourth switching device coupled between the output component and the ground terminal, wherein:

the controller turns on or off the first switching device and the second switching device to control the bandgap core component to operate in the normal operation mode or the low power consumption mode; and the controller turns on or off the third switching device and the fourth switching device to control the output component to operate in the normal operation mode or the low power consumption mode.

2. The bandgap reference circuit of claim 1, wherein the controller is further configured for:

when the bandgap core component operates in the low power consumption mode, detecting the voltage at the reference point starting from a detection timing; and based on the detected voltage at the reference point, generating a low power consumption control signal or a normal operation control signal;

wherein the low power consumption control signal controls the bandgap core component and the output component to operate in the low power consumption mode, and the normal operation control signal controls the bandgap core component and the output component to operate in the normal operation mode.

3. The bandgap reference circuit of claim 1, wherein the detection-starting point is determined based on a duration of the bandgap core component operating in the low power consumption mode in a previous measurement.

4. The bandgap reference circuit of claim 1, wherein:

a changing of the voltage at the reference point in the bandgap core indicates that the output voltage of the output component is going to be unstable.

5. The bandgap reference circuit of claim 1, wherein the controller is further configured for:

in response to determining that the detected voltage at the reference point is larger than a voltage threshold, generating the low power consumption control signal; and in response to determining that the detected voltage at the reference point is less than the voltage threshold, generating the normal operation control signal.

6. The bandgap reference circuit of claim 1, wherein:

the first switching device is a first PMOS transistor;
the second switching device is a first NMOS transistor;
the third switching device is a second PMOS transistor; and
the fourth switching device is a second NMOS transistor;

wherein:

a source of the first PMOS transistor is coupled to the first voltage supply, a gate of the first PMOS transistor is coupled to an output terminal of the controller, and a drain of the first PMOS transistor is coupled to the bandgap core component, a source of the first NMOS transistor is grounded, a gate of the first NMOS transistor is coupled to an inverted signal of an output signal of the controller, and a drain of the first NMOS transistor is coupled to the reference point, a source of the second PMOS transistor is coupled to the first voltage supply, a gate of the second PMOS transistor is coupled to an output terminal of the controller, and a drain of the second PMOS transistor is coupled to the output component, and a source of the second NMOS transistor is grounded, a gate of the second NMOS transistor is coupled to an inverted signal of an output signal of the controller, and a drain of the second NMOS transistor is coupled to the output component.

7. The bandgap reference circuit of claim 1, wherein the controller includes:

a voltage detection controller, configured for generating a detection enable signal according to the duration of the bandgap core component operating in the low power consumption mode in a previous-measurement;

a voltage detector, configured for determining the detection-starting point based on the detection enable signal, detecting the voltage at the reference point starting from the detection starting point, and outputting a first voltage signal according to the detected voltage at the reference point;

a latch, configured for latching the first voltage signal outputted by the voltage detector; and a charging time controller, configured for generating a normal operation control signal and a low power consumption control signal based on the first voltage signal latched by the latch.

8. The bandgap reference circuit of claim 7, wherein:

the normal operation control signal is used for turning on the first switching device and the third switching device; and the low power consumption control signal is used for turning off the first switching device and the third switching device.

9. The bandgap reference circuit of claim 7, wherein the voltage detector includes:

a third PMOS transistor, a third NMOS transistor, a fourth NMOS transistor, and a fifth NMOS transistor;

wherein:

a source of the third PMOS transistor is coupled to a second voltage supply, and a gate of the third PMOS transistor is coupled to the detection enable signal, a source of the third NMOS transistor is coupled to a drain of the third PMOS transistor, a gate of the third NMOS transistor is coupled to the reference point, and a drain of the third NMOS transistor is coupled to an input terminal of the latch and is used as an output terminal of the voltage detector, a gate of the fourth NMOS transistor is coupled to the gate of the third NMOS transistor, a drain of the fourth NMOS transistor is coupled with the drain of the third NMOS transistor, and a gate of the fifth NMOS transistor is coupled to an inverted signal of the detection enable signal, a source of the fifth NMOS transistor is grounded, and a drain of the fifth NMOS transistor is coupled to the source of the fourth NMOS transistor.

10. The bandgap reference circuit of claim 7, wherein the controller further includes:

an electrical-level switching device, configured for performing an electrical level switch to the normal operation control signal or the low power consumption control signal generated by the charging time controller, wherein:

the normal operation control signal after the electrical level switch is used to turn on the first switching device and the third switching device; and the low power consumption control signal after the electrical level switch is used to turn off the first switching device and the third switching device.

11. The bandgap reference circuit of claim 7, wherein the voltage detection controller is further configured for:

determining a ratio between a duration of the bandgap core component operating in the low power consumption mode in a current measurement and a duration of the bandgap core component operating in the low power consumption mode in a previous-measurement; and in response to determining that the ratio reaches a preset ratio threshold value, generating the detection enable signal.

12. The bandgap reference circuit of claim 11, wherein the preset ratio threshold value approximately equals to 95%.

13. The bandgap reference circuit of claim 1, wherein the startup component is configured for:

providing a starting voltage to the bandgap core component and the output component, wherein:

the startup component is turned off after the bandgap core component operating in the normal operation mode.

14. The bandgap reference circuit of claim 11, further comprising:

a fourth PMOS transistor; and
a sixth NMOS transistor;
wherein:
a source of the fourth PMOS transistor is coupled to the first voltage source, a gate of the fourth PMOS transistor is coupled to a starting up signal, and a drain of the fourth PMOS transistor is coupled to the startup component, and
a drain of the sixth NMOS transistor is coupled to the starting component, a source of the sixth NMOS transistor is grounded, and a gate of the sixth NMOS transistor is coupled to an inverted signal of the starting up signal.

15. A method for using a bandgap reference circuit, comprising:

powering on a startup component to provide a starting voltage to enable a bandgap reference circuit including an output component and a bandgap core component coupled between the startup component and the output component, wherein the bandgap core component includes a reference point, and a voltage at the reference point is associated with an output signal of the output component; and using a controller to control the bandgap reference circuit to switch between a low power consumption mode and a normal operation mode by using the voltage at the reference point;

wherein:
when the bandgap core component and the output component operate in the normal operation mode, the bandgap reference circuit outputs a stable voltage and has a first power consumption, and
when the bandgap core component and the output component operate in the low power consumption mode, the bandgap reference circuit has a second power consumption less than the first power consumption;

recording a duration time that the bandgap reference circuit is in the low power consumption mode in a current measurement;

determining whether the duration time is larger than a record time in a current measurement; and in response to determining that the duration time is larger than the record time in a current measurement, starting to detect the voltage at the reference point.

16. The method of claim 15, further comprising:

determining whether the voltage at the reference point is smaller than a voltage threshold; and in response to determining that the voltage at the reference point is larger than or equal to the voltage threshold, generating a normal operation control signal by the controller to switch the bandgap reference circuit from the low power consumption mode to the normal operation mode.

17. The method of claim 16, further comprising:

calculating a record time in a next measurement based on the duration time and a preset ratio.

* * * * *